US011062760B1

United States Patent
Koh

(10) Patent No.: US 11,062,760 B1
(45) Date of Patent: Jul. 13, 2021

(54) MEMORY DEVICE INCLUDING DATA INPUT/OUTPUT CIRCUIT

(71) Applicant: SK hynix Inc., Gyeonggi-do (KR)

(72) Inventor: Insung Koh, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/893,978

(22) Filed: Jun. 5, 2020

(30) Foreign Application Priority Data

Dec. 30, 2019 (KR) .................. 10-2019-0177503

(51) Int. Cl.
| | | |
|---|---|---|
| G11C 11/4093 | (2006.01) | |
| G11C 11/4099 | (2006.01) | |
| G11C 11/404 | (2006.01) | |
| G11C 11/4074 | (2006.01) | |
| G11C 5/02 | (2006.01) | |

(52) U.S. Cl.
CPC ......... *G11C 11/4093* (2013.01); *G11C 5/025* (2013.01); *G11C 11/404* (2013.01); *G11C 11/4074* (2013.01); *G11C 11/4099* (2013.01)

(58) Field of Classification Search
CPC .............. G11C 11/4093; G11C 11/404; G11C 11/4099; G11C 11/4074; G11C 5/025
See application file for complete search history.

(56) References Cited

U.S. PATENT DOCUMENTS

| | | | | |
|---|---|---|---|---|
| 7,330,049 | B2 * | 2/2008 | Perisetty | H01L 27/0921 257/E27.063 |
| 7,495,471 | B2 * | 2/2009 | Perisetty | H03K 19/0013 326/38 |
| 7,501,849 | B2 * | 3/2009 | Perisetty | H03K 19/00315 326/15 |
| 7,598,794 | B1 * | 10/2009 | Stansell | H03K 19/00315 327/434 |
| 2018/0343008 | A1 * | 11/2018 | Lee | H03K 19/01742 |
| 2020/0244266 | A1 * | 7/2020 | Lee | H03K 19/01742 |

FOREIGN PATENT DOCUMENTS

| | | |
|---|---|---|
| KR | 10-2003-0031224 | 4/2003 |
| KR | 10-0543915 | 1/2006 |
| KR | 10-1218604 | 1/2013 |

* cited by examiner

*Primary Examiner* — Tri M Hoang
(74) *Attorney, Agent, or Firm* — IP & T Group LLP

(57) ABSTRACT

A memory device includes a plurality of data input/output (I/O) groups each including data I/O circuits, each data I/O circuit comprising a transistor having a predetermined threshold voltage according to a bulk voltage supplied to a bulk terminal thereof; a control circuit suitable for generating a control signal according to a data I/O mode; and a plurality of voltage supply circuits suitable for independently supplying bulk voltages to the plurality of data I/O groups, and changing, in response to the control signal, a level of a bulk voltage corresponding to data I/O groups unused in the data I/O mode, among the plurality of data I/O groups.

9 Claims, 3 Drawing Sheets

MEMORY DEVICE INCLUDING DATA INPUT/OUTPUT CIRCUIT

CROSS-REFERENCE TO RELATED APPLICATION

This application claims priority under 35 U.S.C. § 119 to Korean Patent Application No. 10-2019-0177503 filed on Dec. 30, 2019, which is incorporated herein by reference in its entirety.

BACKGROUND

1. Field

Various embodiments relate to a memory device, and more particularly, to a memory device supporting a data I/O mode.

2. Discussion of the Related Art

As the demand for a high-speed operation increases with an increase in degree of integration of semiconductor memory devices, research is being conducted on various methods for raising data transfer rates of the semiconductor memory devices. For example, a semiconductor memory device, such as a DDR SDRAM operating synchronized with a clock signal, can consecutively input/output a series of data in response to a single write or read command. The semiconductor memory device may set a burst length or the like using a mode register set, and input/output continuous data according to the set burst length when a single write or read command is applied.

The semiconductor memory device may selectively use a plurality of data I/O circuits while inputting/outputting multi-bit data in parallel. That is, the plurality of data I/O circuits may be selectively used depending on the width of data inputted to/outputted from the semiconductor memory device simultaneously. The I/O data width of the semiconductor memory device is an option which may be set by a user, and is defined as a data I/O mode or the like in the specification of the semiconductor memory device.

For example, in a case where a semiconductor memory device has 16 I/O pads, when the data I/O mode is set as the X16 mode, a data I/O operation may be performed through the 16 I/O pads. When the data I/O mode is set as the X8 mode, a data I/O operation may be performed through eight data I/O pads among the 16 I/O pads. When the data I/O mode is set as the X4 mode, a data I/O operation may be performed through four data I/O pads among the 16 I/O pads.

The semiconductor memory device may be designed to support all of the data I/O modes rather than only a specific data I/O mode. Furthermore, option processing (e.g., fuse cutting or option pad bonding) may be performed for the semiconductor memory device to operate in a specific I/O mode. In this case, the semiconductor memory device is required to prevent current consumption caused by an unnecessary operation of data I/O circuits which are not used according to the data I/O mode.

SUMMARY

Various embodiments are directed to a memory device capable of independently supplying and controlling bulk voltages for data I/O circuits according to a data I/O mode, and thereby reducing current consumption caused by a data I/O circuit which is not used according to the data I/O mode.

In an embodiment, a memory device may include: a plurality of data input/output (I/O) groups each including data I/O circuits, each data I/O circuit comprising a transistor having a predetermined threshold voltage according to a bulk voltage supplied to a bulk terminal thereof; a control circuit suitable for generating a control signal according to a data I/O mode; and a plurality of voltage supply circuits suitable for independently supplying bulk voltages to the plurality of data I/O groups, and changing, in response to the control signal, a level of a bulk voltage corresponding to data I/O groups unused in the data I/O mode, among the plurality of data I/O groups.

In an embodiment, a memory device may include: a plurality of data input/output (I/O) groups each comprising a transistor coupled between a supply voltage terminal and a ground voltage terminal; and a plurality of voltage drivers suitable for driving a bulk voltage of the transistor included in a data I/O group unused in a data I/O mode, among the plurality of data I/O groups, at a boost voltage level higher than a supply voltage level or a back bias voltage level lower than a ground voltage level.

In an embodiment, a memory device may include: first to fourth data input/output (I/O) groups suitable for receiving and transmitting write data and read data; and first to fourth voltage supply circuits suitable for independently supplying bulk voltages of MOS transistors included in the first to fourth data I/O groups, and changing a bulk voltage of MOS transistors included in a data I/O group unused in a data I/O mode, among the first to fourth data I/O groups.

In an embodiment, a memory device may include: a plurality of data input/output (I/O) circuits suitable for receiving and transmitting write data and read data in parallel, each of the plurality of data I/O circuits including MOS transistors, wherein data I/O circuits used in a data I/O mode, among the plurality of data I/O circuits are supplied with a first bulk voltage for the MOS transistors, and wherein the other data I/O circuits unused in the data I/O mode, among the plurality of data I/O circuits are supplied with a second bulk voltage for the MOS transistors, which has a level different from the first bulk voltage to raise a threshold voltage of the MOS transistors.

In accordance with the embodiments of the present invention, the data I/O paths of a memory device are grouped to independently supply the bulk voltages to the circuits corresponding to the respective data I/O paths. The bulk voltages of the circuits corresponding to the data I/O paths selected according to the data I/O mode of the memory device may be adjusted. Therefore, in the memory device having various data I/O modes, the data I/O paths may be selectively used, and the circuits on data I/O paths which are not used may be disabled to reduce current consumption.

DETAILED DESCRIPTION

Figure 1:
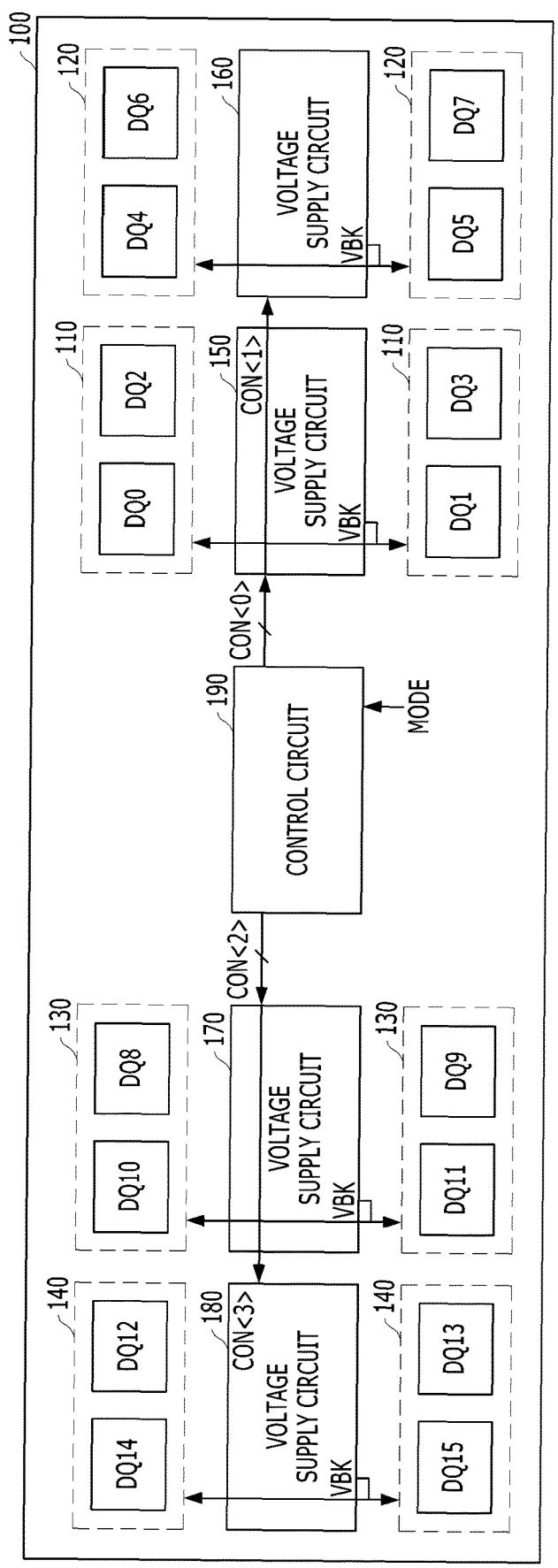
FIG. 1 is a diagram illustrating a memory device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Throughout the specification, when one element is referred to as being 'connected to' or 'coupled to' another element, it may indicate that the former element is directly connected or coupled to the latter element or electrically connected or coupled to the latter element with another element interposed therebetween. Furthermore, when an element "includes" or "comprises" a component, it means that the element does not exclude another component but may further include or comprise another component, unless referred to the contrary. Moreover, although components described in the specification are represented in singular form, the embodiments of the present invention are not limited thereto, but the corresponding components may also be represented in plural form.

FIG. 1 is a diagram illustrating a memory device 100 in accordance with an embodiment of the present invention. FIG. 1 illustrates a region in which circuits for inputting/outputting data among components included in the memory device 100 are arranged.

The memory device 100 may input/output multi-bit data in parallel. For example, the memory device 100 may input/output four-bit data, eight-bit data or 16-bit data according to a data I/O mode X4, X8 or X16.

Referring to FIG. 1, the memory device 100 may have 16 data I/O paths to support all of the data I/O modes X4, X8 and X16, and include data I/O circuits DQ0 to DQ15 corresponding to the respective data I/O paths. The number of the data I/O circuits DQ0 to DQ15 may be changed according to the data I/O mode in which the memory device 100 operates.

In order for the memory device 100 to input/output data according to the data I/O mode X4, X8 or X16, the data I/O circuits DQ0 to DQ15 may be grouped into first to fourth data I/O groups 110, 120, 130 and 140. The memory device 100 may further include a control circuit 190 and first to fourth voltage supply circuits 150, 160, 170 and 180 corresponding to the first to fourth data I/O groups 110, 120, 130 and 140.

According to the data I/O mode X4, X8 or X16, the control circuit 190 may generate a control signal CON. The control circuit 190 may generate the control signal CON to change a bulk voltage VBK of a data I/O group unused among the first to fourth data I/O groups 110, 120, 130 and 140, according to the data I/O mode X4, X8 or X16. The control signal CON may include multi-bits CON<0:3> corresponding to the first to fourth data I/O groups 110, 120, 130 and 140. According to the data I/O mode X4, X8 or X16, the memory device 100 may activate a bit corresponding to the unused data I/O group, among the multi-bits CON<0:3>.

The control circuit 190 may generate the control signal CON in response to a mode signal MODE. The mode signal MODE may indicate the width of data inputted to/outputted from the memory device 100 in parallel (i.e., the data I/O mode X4, X8, or X16). The mode signal MODE may be generated through fuse cutting or option pad bonding.

The first to fourth voltage supply circuits 150, 160, 170 and 180 may independently supply bulk voltages VBK of the first to fourth data I/O groups 110, 120, 130 and 140. In response to the bits CON<0:3> of the control signal CON, the first to fourth voltage supply circuits 150, 160, 170 and 180 may change the bulk voltages VBK of the first to fourth data I/O groups 110, 120, 130 and 140. According to the data I/O mode X4, X8 or X16, the first to fourth voltage supply circuits 150, 160, 170 and 180 may change the bulk voltage VBK of the unused data I/O group among the first to fourth data I/O groups 110, 120, 130 and 140.

When the memory device 100 operates in the data I/O mode X4 (i.e., the minimum width), the first data I/O group 110 (i.e., the data I/O circuits DQ0 to DQ3) may be used to input/output write data and read data. Therefore, the second to fourth data I/O groups 120, 130 and 140 (i.e., the data I/O circuits DQ4 to DQ15) may be unused or disabled. In response to the mode signal MODE indicating the data I/O mode X4, the control circuit 190 may activate bits CON<1:3> of the control signal CON, corresponding to the second to fourth data I/O groups 120, 130 and 140. According to the activated bits CON<1:3> of the control signal CON, the second to fourth voltage supply circuits 160, 170 and 180 may reduce power consumption by changing a level of the bulk voltages VBK of the second to fourth data I/O groups 120, 130 and 140.

When the memory device 100 operates in the data I/O mode X8 (i.e., the middle width), the first and second data I/O groups 110 and 120 (i.e., the data I/O circuits DQ0 to DQ7) may be used to input/output write data and read data. Therefore, the third and fourth data I/O groups 130 and 140 (i.e., the data I/O circuits DQ8 to DQ15) may be unused or disabled. In response to the mode signal MODE indicating the data I/O mode X8, the control circuit 190 may activate the bits CON<2:3> of the control signal CON, corresponding to the third and fourth data I/O groups 130 and 140. According to the activated bits CON<2:3> of the control signal CON, the third and fourth voltage supply circuits 170 and 180 may reduce power consumption by changing a level of the bulk voltages VBK of the third and fourth data I/O groups 130 and 140.

When the memory device 100 operates in the data I/O mode X16 (i.e., the maximum width), the first to fourth data I/O groups 110, 120, 130 and 140 (i.e., the data I/O circuits DQ0 to DQ15) may be used to input/output write data and read data. Therefore, the control circuit 190 may deactivate all the bits CON<0:3> of the control signal CON, and the first to fourth voltage supply circuits 150, 160, 170 and 180 may supply the bulk voltages VBK of the first to fourth data I/O groups 110, 120, 130 and 140 without changing a level of the bulk voltages VBK.

In FIG. 1, the data I/O circuits DQ0 to DQ15 may include internal circuits provided on the data I/O paths of the memory device 100. The data I/O circuits DQ0 to DQ15 may include a data I/O buffer for receiving and transmitting I/O data, a data latch for latching the data received and transmitted by the data I/O buffer, and a data driver for transmitting the latched data to an internal core region.

The data I/O circuits DQ0 to DQ15 may be implemented by a plurality of transistors coupled between a supply voltage terminal and a ground voltage terminal. The plurality of transistors may be operated according to a supply voltage applied through gate terminals thereof, and have threshold voltages which are changed according to bulk voltages applied through bulk terminals thereof.

Figure 2A:
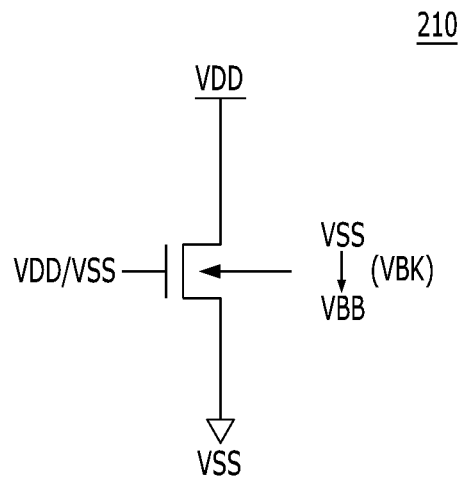
FIGS. 2A and 2B are diagrams illustrating transistors included in data I/O group of FIG. 1.
Figure 2B:
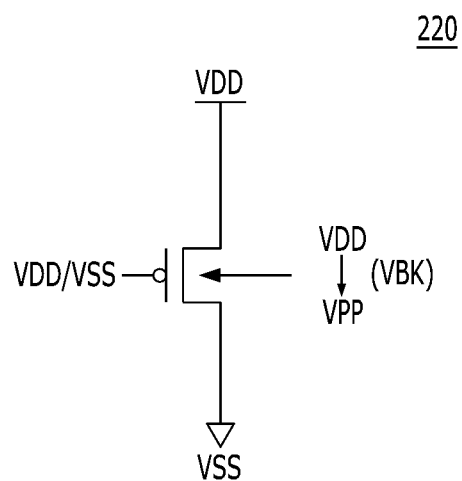

FIGS. 2A and 2B are diagrams illustrating transistors included in the data I/O circuits DQ to DQ15 of FIG. 1. Each of the data I/O circuits DQ0 to DQ15 may include an NMOS transistor and a PMOS transistor, which are illustrated in FIGS. 2A and 2B, respectively.

Referring to FIG. 2A, an NMOS transistor 210 included in each of the data I/O circuits DQ to DQ15 may receive a supply voltage VDD and a ground voltage VSS through drain and source terminals thereof. Furthermore, the NMOS transistor 210 may receive the ground voltage VSS through a bulk terminal thereof, and be operated by the supply voltage VDD and the ground voltage VSS applied to a gate terminal thereof.

In an embodiment, the levels of the bulk voltages VBK of the data I/O circuits DQ0 to DQ15 may be changed according to the data I/O mode X4, X8 or X16. That is, a back bias voltage VBB lower than the ground voltage VSS may be applied to the bulk terminals of the NMOS transistors 210 included in the data I/O circuits DQ0 to DQ15, instead of the ground voltage VSS. The threshold voltages of the NMOS transistors 210 may be changed according to the bulk voltage VBK.

For example, when a level of the supply voltage VDD is 1.2V, a level of the back bias voltage VBB may be −0.8V. The lower the bulk voltage VBK of the NMOS transistor 210, the higher the threshold voltage of the NMOS transistor 210. Therefore, when the data I/O circuits DQ0 to DQ15 are in a standby state, the threshold voltages of the NMOS transistors 210 included in the data I/O circuits DQ0 to DQ15 may be raised to reduce a gate-off current leakage while preventing a standby current flow.

Referring to FIG. 2B, a PMOS transistor 220 included in each of the data I/O circuits DQ0 to DQ15 may receive the ground voltage VSS and the supply voltage VDD through drain and source terminals thereof, respectively. Furthermore, the PMOS transistor 220 may receive the supply voltage VDD through a bulk terminal thereof, and be operated by the supply voltage VDD and the ground voltage VSS applied to a gate terminal thereof.

In an embodiment, the levels of the bulk voltages VBK of the data I/O circuits DQ0 to DQ15 may be changed according to the data I/O mode X4, X8 or X16. That is, a boost voltage VPP higher than the supply voltage VDD may be applied to the bulk terminals of the PMOS transistors 220 included in the data I/O circuits DQ0 to DQ15, instead of the supply voltage VDD. The threshold voltages of the PMOS transistors 220 may be changed according to the bulk voltage VBL.

For example, when the level of the supply voltage VDD is 1.2V, the level of the boost voltage VPP may be 1.8V. The higher the bulk voltage VBK of the PMOS transistor 220, the higher the threshold voltage of the PMOS transistor 220. Therefore, when the data I/O circuits DQ0 to DQ15 are in the standby state, the threshold voltages of the PMOS transistors 220 included in the data I/O circuits DQ0 to DQ15 may be raised to reduce a gate-off current leakage while preventing a standby current flow.

The operation of the memory device 100 in accordance with the embodiment of the present invention will be described with reference to FIGS. 1, 2A and 2B. During the data I/O mode X4 with the minimum width, the memory device 100 may input/output write data and read data through the data I/O pad corresponding to the first data I/O group 110. The memory device 100 may change the bulk voltages VBK of the second to fourth data I/O groups 120, 130 and 140 which are in the standby state. That is, the memory device 100 may change all of the bulk voltages VBK of the I/O buffers, the data latches and the data drivers on the data paths corresponding to the second to fourth data I/O groups 120, 130 and 140. Therefore, the threshold voltages of the transistors included in the data paths corresponding to the second to fourth data I/O groups 120, 130 and 140 may be raised to prevent a standby current flow.

When operating in the data I/O mode X8 with the middle width, the memory device 100 may input/output write data and read data through the data I/O pads corresponding to the first and second data I/O groups 110 and 120. The memory device 100 may change the bulk voltages VBK of the third and fourth data I/O groups 130 and 140 which are in the standby state. That is, the memory device 100 may change all of the bulk voltages VBK of the I/O buffers, the data latches and the data drivers on the data paths corresponding to the third and fourth data I/O groups 130 and 140. Therefore, the threshold voltages of the transistors included in the data paths corresponding to the third and fourth data I/O groups 130 and 140 may be raised to prevent a standby current flow.

On the other hand, when operating in the data I/O mode X16 with the maximum width, the memory device 100 may input/output write data and read data through the data I/O pads corresponding to the first to fourth data I/O groups 110, 120, 130 and 140. Therefore, the memory device 100 may operate the I/O buffers, the data latches and the data drivers on the data paths corresponding to the first to fourth data I/O groups 110, 120, 130 and 140 without changing the bulk voltages VBK.

Figure 3:
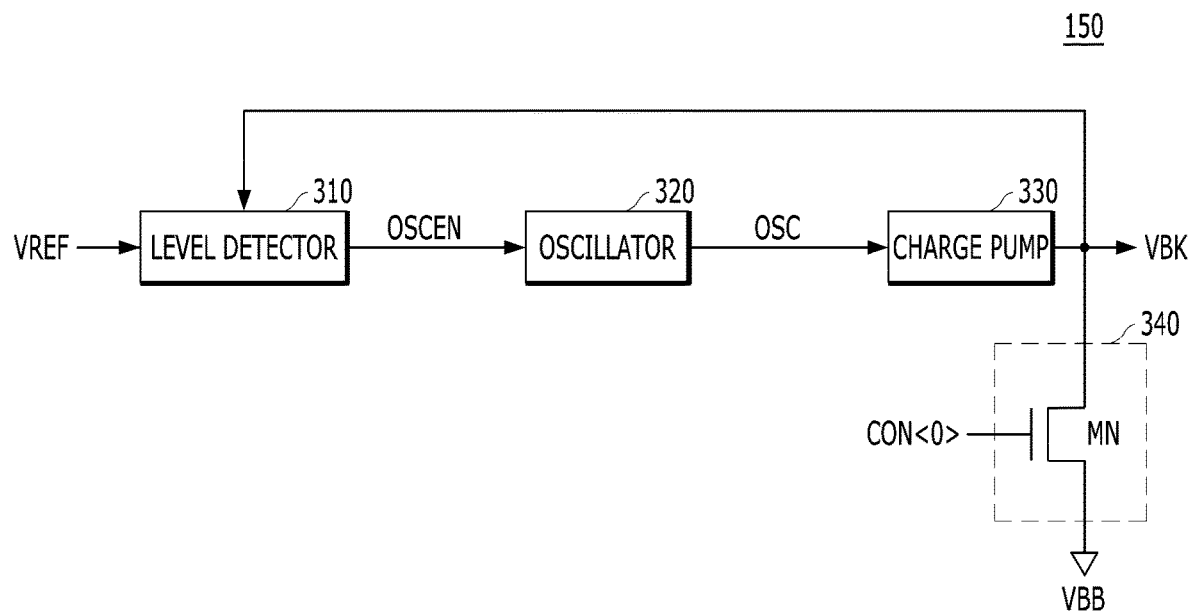
FIG. 3 is a detailed diagram of a voltage supply circuit of FIG. 1.

FIG. 3 is a detailed diagram of the voltage supply circuit of FIG. 1.

FIG. 3 exemplarily illustrates the first voltage supply circuit 150 for supplying the bulk voltage VBK of the NMOS transistor included in the first data I/O group 110. The first voltage supply circuit 150 may include a level detector 310, an oscillator 320, a charge pump 330 and a voltage driver 340.

The level detector 310 may compare the bulk voltage VBK and a reference voltage VREF, and output an enable signal OSCEN. The reference voltage VREF may have a level of the ground voltage VSS. For example, when the bulk voltage VBK is less than the reference voltage VREF, the level detector 310 may activate the enable signal OSCEN. The oscillator 320 may operate according to the enable signal OSCEN, and generate an oscillation signal OSC. The charge pump 330 may perform a charge pumping operation on the bulk voltage VBK terminal according to the oscillation signal OSC. As such, the first voltage supply circuit 150 may generate the bulk voltage VBK corresponding to a level of the reference voltage VREF, and supply the generated voltage to the first data I/O group 110.

The voltage driver 340 may drive the bulk voltage VBK at a level of the back bias voltage VBB in response to the control signal CON. The voltage driver 340 may include an NMOS transistor MN coupled between the bulk voltage VBK terminal and the back bias voltage VBB terminal. When a corresponding bit CON<0> of the control signal CON is activated, the voltage driver 340 may drive the bulk voltage VBK terminal with the back bias voltage VBB.

Figure 4:
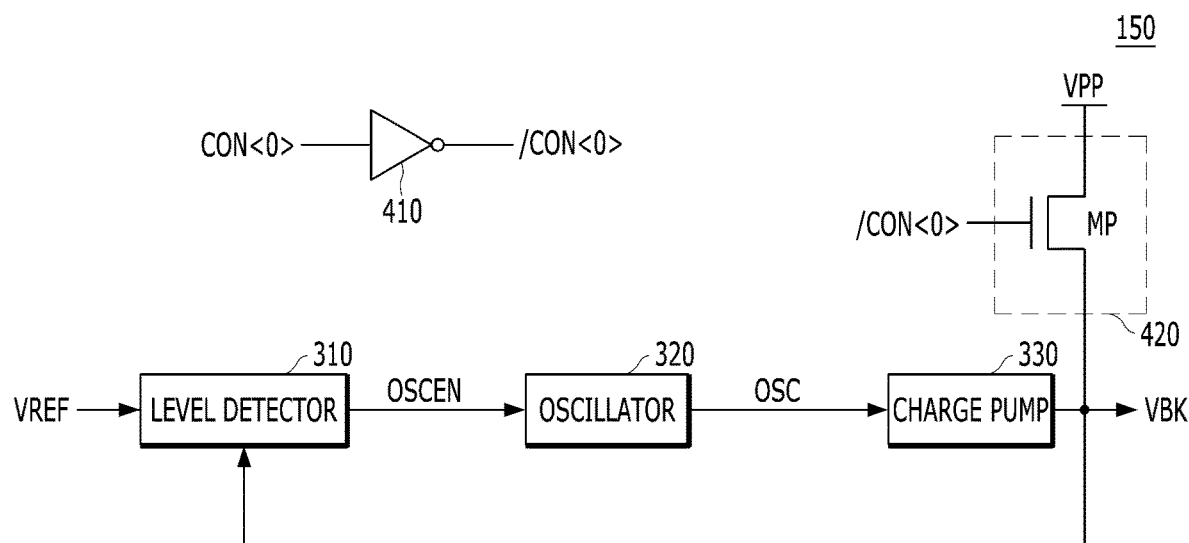
FIG. 4 is another detailed diagram of the voltage supply circuit of FIG. 1.

FIG. 4 is another detailed diagram of the voltage supply circuit 150 of FIG. 1.

Referring to FIG. 4, the first voltage supply circuit 150 may supply the bulk voltage VBK of the PMOS transistor included in the first data I/O group 110. When the bulk voltage VBK of the PMOS transistor is supplied, the reference voltage VREF may have a level of the supply voltage VDD, and the first voltage supply circuit 150 may generate the bulk voltage VBK at the level of the supply voltage VDD. The first voltage supply circuit 150 may include the level detector 310, the oscillator 320, the charge pump 330, an inverter 410, and a voltage driver 420.

When the corresponding bit CON<0> of the control signal CON is activated, the inverter 410 may invert the bit CON<0> to obtain a complementary bit/CON<0> of the control signal CON. The voltage driver 420 may drive the bulk voltage VBK at a level of the boost voltage VPP in response to the bit/CON<0> of the control signal CON. The voltage driver 420 may include a PMOS transistor MP coupled between the boost voltage VPP terminal and the bulk voltage VBK terminal, and controlled in response to the bit/CON<0> of the control signal CON.

In accordance with the embodiments of the present invention, the bulk voltage may be independently supplied to each of the data I/O paths of the memory device. According to the data I/O mode, the bulk voltage may be additionally driven for a data I/O path in the standby state. Through this operation, the threshold voltages of the transistors provided on the data I/O path in the standby state may be adjusted (i.e., raised) to prevent a standby current and a leakage current while improving the performance of the memory device.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
   a plurality of data input/output (I/O) groups each including data I/O circuits, each data I/O circuit comprising a transistor having a predetermined threshold voltage according to a bulk voltage supplied to a bulk terminal thereof;
   a control circuit suitable for generating a control signal according to a data I/O mode; and
   a plurality of voltage supply circuits suitable for independently supplying bulk voltages to the plurality of data I/O groups, and changing, in response to the control signal, a level of a bulk voltage corresponding to data I/O groups unused in the data I/O mode, among the plurality of data I/O groups.

2. The memory device of claim 1, wherein the transistor comprises an NMOS transistor, and the plurality of voltage supply circuits supply the bulk voltages at a ground voltage level.

3. The memory device of claim 2, wherein the plurality of voltage supply circuits change, in response to the control signal, the level of the bulk voltage of the data I/O group unused in the data I/O mode, among the plurality of data I/O groups, to a back bias voltage level lower than the ground voltage level.

4. The memory device of claim 1, wherein the transistor comprises a PMOS transistor, and the plurality of voltage supply circuits supply the bulk voltages at a supply voltage level.

5. The memory device of claim 4, wherein the plurality of voltage supply circuits change, in response to the control signal, the level of the bulk voltage of the data I/O group unused in the data I/O mode, among the plurality of data I/O groups, to a boost voltage level higher than the supply voltage level.

6. The memory device of claim 1, wherein each of the voltage supply circuits comprises:
   a level detector suitable for comparing a level of a corresponding bulk voltage to a level of a reference voltage to output an enable signal;
   an oscillator suitable for generating an oscillation signal in response to the enable signal;
   a charge pump suitable for performing a charge pumping operation on a terminal of the corresponding bulk voltage in response to the oscillation signal; and
   a voltage driver suitable for additionally driving the terminal of the corresponding bulk voltage in response to the control signal.

7. The memory device of claim 1, wherein the control signal comprises multi-bits corresponding to the plurality of data I/O groups, and the control circuit activates a bit of the control signal, corresponding to the unused data I/O group, according to the data I/O mode.

8. The memory device of claim 1, wherein the data I/O mode indicates a width of data inputted and outputted to/from the memory device in parallel.

9. The memory device of claim 8, wherein the data I/O mode is defined by fuse cutting or option pad bonding.

* * * * *